(12) United States Patent
Huang et al.

(10) Patent No.: US 11,696,426 B2
(45) Date of Patent: Jul. 4, 2023

(54) AUTOMOTIVE NETWORK COMMUNICATION DEVICES AND CABLING WITH ELECTROMAGNETIC SHIELDING

(71) Applicant: Marvell Asia Pte Ltd, Singapore (SG)

(72) Inventors: Shaowu Huang, Sunnyvale, CA (US); Dance Wu, Palo Alto, CA (US)

(73) Assignee: MARVELL ASIA PTE LTD, Singapore (SG)

(*) Notice: Subject to any disclaimer, the term of this patent is extended or adjusted under 35 U.S.C. 154(b) by 151 days.

(21) Appl. No.: 17/183,437

(22) Filed: Feb. 24, 2021

(65) Prior Publication Data

US 2021/0267101 A1    Aug. 26, 2021

Related U.S. Application Data

(60) Provisional application No. 62/981,951, filed on Feb. 26, 2020.

(51) Int. Cl.
| | | |
|---|---|---|
| *H05K 9/00* | (2006.01) | |
| *H01R 13/6591* | (2011.01) | |
| *B60R 16/023* | (2006.01) | |
| *H01R 24/56* | (2011.01) | |
| *H01R 24/86* | (2011.01) | |

(Continued)

(52) U.S. Cl.
CPC .......... *H05K 9/0064* (2013.01); *B60R 16/023* (2013.01); *H01R 13/65912* (2020.08); *H01R 24/562* (2013.01); *H01R 24/86* (2013.01); *H01R 2103/00* (2013.01); *H01R 2105/00* (2013.01); *H01R 2201/04* (2013.01);

(Continued)

(58) Field of Classification Search
CPC ............ H05K 9/0064; H01R 13/65912; H01R 24/562; H01R 24/86; H01R 103/00
USPC ......................................................... 439/607
See application file for complete search history.

(56) References Cited

U.S. PATENT DOCUMENTS

| | | | | |
|---|---|---|---|---|
| 5,274,712 A | * | 12/1993 | Lindsay | ................. H01B 11/06 |
| | | | | 174/105 R |
| 6,370,449 B1 | * | 4/2002 | Razavi | ...................... H04L 9/40 |
| | | | | 701/32.7 |

(Continued)

OTHER PUBLICATIONS

IEEE Std 802.3bp-2016, "Amendment 4: Physical Layer Specifications and Management Parameters for 1 Gb/s Operation over a Single Twisted-Pair Copper Cable," IEEE Standard for Ethernet, IEEE Standards Association, pp. 1-211, Jun. 2016.

(Continued)

*Primary Examiner* — Alexander Gilman

(57) ABSTRACT

A network communication device includes communication circuitry configured to communicate signals over a network cable, and a connector configured to connect to the network cable. The connector includes one or more signal terminals, an inner shield connection and an outer shield connection. The one or more signal terminals are configured to connect to one or more signal conductors of the network cable for communicating the signals. The inner shield connection surrounds the one or more signal terminals and is connected to a circuit ground of the communication circuitry. The outer shield connection surrounds the inner shield connection and is connected to an additional ground of the network communication device, the additional ground being different from the circuit ground.

13 Claims, 3 Drawing Sheets

(51) Int. Cl.
*H01R 103/00* (2006.01)
*H01R 105/00* (2006.01)
*H04L 67/12* (2022.01)

(52) U.S. Cl.
CPC .......... *H01R 2201/26* (2013.01); *H04L 67/12* (2013.01); *H05K 9/0049* (2013.01)

(56) References Cited

U.S. PATENT DOCUMENTS

| | | | | |
|---|---|---|---|---|
| 6,754,183 | B1* | 6/2004 | Razavi | H04W 92/02 |
| | | | | 370/254 |
| 10,741,308 | B2* | 8/2020 | Hornung | H01R 13/6592 |
| 11,069,458 | B2* | 7/2021 | Hornung | H01B 7/1875 |
| 2001/0051863 | A1* | 12/2001 | Razavi | G01C 21/26 |
| | | | | 703/23 |
| 2006/0214506 | A1* | 9/2006 | Albright | B60T 7/20 |
| | | | | 303/123 |
| 2015/0162692 | A1* | 6/2015 | Jones | H01R 24/28 |
| | | | | 439/660 |
| 2015/0162697 | A1* | 6/2015 | Jones | H01R 13/432 |
| | | | | 439/626 |
| 2015/0162704 | A1* | 6/2015 | Jones | H01R 13/627 |
| | | | | 439/345 |
| 2015/0255928 | A1* | 9/2015 | Liptak | H01R 13/65915 |
| | | | | 174/105 R |
| 2016/0056585 | A1* | 2/2016 | Dunwoody | H01R 13/6592 |
| | | | | 439/607.41 |
| 2016/0300642 | A1* | 10/2016 | Kodama | H01B 11/20 |
| 2016/0343474 | A1* | 11/2016 | Nichols | H01B 11/1895 |
| 2018/0054028 | A1* | 2/2018 | Carbone | H01R 24/56 |
| 2018/0062280 | A1* | 3/2018 | Boyer | H01B 1/026 |
| 2018/0248319 | A1* | 8/2018 | Matroja | H01R 13/6473 |
| 2019/0229452 | A1* | 7/2019 | Suzuki | H01R 24/50 |
| 2020/0351168 | A1* | 11/2020 | Hirano | H04L 67/12 |
| 2020/0412813 | A1* | 12/2020 | Mong | B61L 15/0036 |
| 2021/0267101 | A1* | 8/2021 | Huang | H05K 9/006 |
| 2022/0094108 | A1* | 3/2022 | Watanabe | H01R 24/86 |

OTHER PUBLICATIONS

IEEE Std 802.3bw-2015, "Amendment 1: Physical Layer Specifications and Management Parameters for 100 Mb/s Operation over a Single Balanced Twisted-Pair Cable (100BASE-T1)," IEEE Standard for Ethernet, IEEE Standards Association, pp. 1-88, Oct. 2015.
IEEE Std 802.3cg-2019, "Amendment 5: Physical Layers Specifications and Management Parameters for 10 Mb/s Operation and Associated Power Delivery over a Single Balanced Pair of Conductors," IEEE Standard for Ethernet, IEEE Standards Association, pp. 1-256, Nov. 2019.
IEEE Std 802.3ch-2020, "Amendment 8: Physical Layers Specifications and Management Parameters for 2.5 Gb/s, 5 Gb/s and 10 Gb/s Automotive Electrical Ethernet," IEEE Standard for Ethernet, IEEE Standards Association, pp. 1-207, Jun. 2020.

* cited by examiner

AUTOMOTIVE NETWORK COMMUNICATION DEVICES AND CABLING WITH ELECTROMAGNETIC SHIELDING

CROSS-REFERENCE TO RELATED APPLICATIONS

This application claims the benefit of U.S. Provisional Patent Application 62/981,951, filed Feb. 26, 2020, whose disclosure is incorporated herein by reference.

FIELD OF THE DISCLOSURE

The present disclosure relates generally to communication networks, and particularly to network devices, cables and connectors having improved Electromagnetic Compatibility (EMC) performance.

BACKGROUND

Some communication network environments, such as automotive networks and industrial networks, are often characterized by high levels of electromagnetic interference (EMI). Various techniques are used for reducing EMI in network cables and connectors. For high-speed network operating at high frequencies in harsh EMI environments such as multi-gig automotive Ethernet, unshielded cables may not provide sufficient EMI protection. Some networks employ Shielded Twisted-Pair (STP) and Shielded Parallel Pair (SPP) cabling for differential signal transmission. Other networks employ single-ended signal transmission over inherently shielded coaxial (coax) cables. Many of such shielded cables, including STP, SPP and coax, employ a double shield, e.g., a foil and a braid that together provide both electromagnetic shielding and mechanical strength.

The description above is presented as a general overview of related art in this field and should not be construed as an admission that any of the information it contains constitutes prior art against the present patent application.

SUMMARY

An embodiment that is described herein provides a network communication device including communication circuitry configured to communicate signals over a network cable, and a connector configured to connect to the network cable. The connector includes one or more signal terminals, an inner shield connection and an outer shield connection. The one or more signal terminals are configured to connect to one or more signal conductors of the network cable for communicating the signals. The inner shield connection surrounds the one or more signal terminals and is connected to a circuit ground of the communication circuitry. The outer shield connection surrounds the inner shield connection and is connected to an additional ground of the network communication device, the additional ground being different from the circuit ground.

In some embodiments, the inner shield connection is configured to provide a return path for the signals, and the outer shield connection is configured to reduce electromagnetic interference to and from the signals.

In some embodiments, the inner shield connection is configured to be connected to an inner shield layer of the network cable, and the outer shield connection is configured to be connected to an outer shield layer of the network cable, different from the inner shield layer.

In an embodiment, the connector includes a dual-shield section that surrounds the one or more signal terminals and extends toward the network cable, and the inner and outer shield connections are electrically-insulated from one another along the dual-shield section and are electrically-shorted to one another at a distal end of the dual-shield section.

In a disclosed embodiment, the additional ground includes an enclosure of the network communication device. In an alternative embodiment, the additional ground includes an additional circuit ground of the communication circuitry.

There is additionally provided, in accordance with an embodiment that is described herein, a network cable includes one or more signal conductors, an inner shield layer, an outer shield layer, and a connector. The one or more signal conductors run along the network cable and are configured to communicate signals. The inner shield layer runs along the network cable, surrounds the signal conductors and is electrically-insulated from the signal conductors. The outer shield layer runs from an end of the network cable up to a distal end of a partial section of the network cable, surrounds the shield layer and is electrically-insulated from the inner shield layer along the partial section and electrically-shorted to the inner shield layer at the distal end of the partial section. The connector is fitted at the end of the network cable and includes one or more signal terminals connected to the one or more signal conductors, an inner shield connection that surrounds the one or more signal terminals and is connected to the inner shield layer, and an outer shield connection that surrounds the inner shield connection and is connected to the outer shield layer.

In some embodiments, the inner shield connection is configured to provide a return path for the signals, and the outer shield connection is configured to reduce electromagnetic interference to and from the signals.

There is further provided, in accordance with an embodiment that is described herein, a method for reducing electromagnetic interference in a network communication device. The method includes connecting communication circuitry of the network communication device to one or more signal conductors of a network cable. A circuit ground of the communication circuitry is connected to an inner shield layer of the network cable, wherein the inner shield layer surrounds the one or more signal conductors. An additional ground of the network communication device, the additional ground being different from the circuit ground, is connected to an outer shield layer of the network cable, wherein the outer shield connection surrounds the inner shield connection.

The present disclosure will be more fully understood from the following detailed description of the embodiments thereof, taken together with the drawings in which:

DETAILED DESCRIPTION OF EMBODIMENTS

Figure 1:
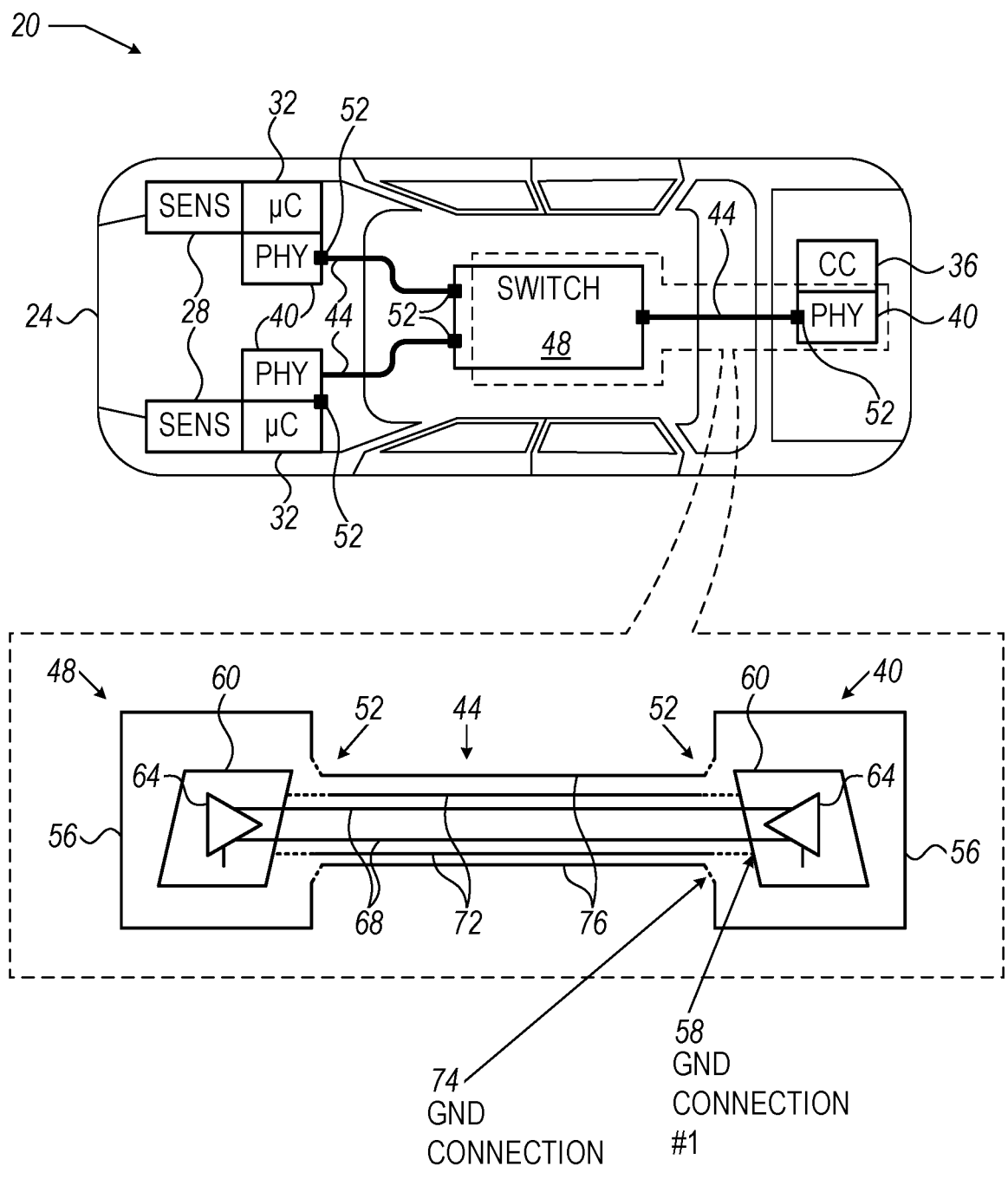
FIG. 1 is a block diagram that schematically illustrates an automotive communication system with high EMC performance cabling, in accordance with an embodiment that is described herein.

Embodiments that are described herein provide improved cabling solutions for communication networks. Disclosed embodiments provide communication devices (e.g., Ethernet transceivers), network cables and connectors having high-performance shielding against electromagnetic interference (EMI). The embodiments described below refer mainly to automotive Ethernet networks, solely by way of example. The disclosed techniques are applicable and useful in any other environment having high levels of EMI and/or stringent EMI suppression requirements, for example in industrial networks and home networks.

In some embodiments, a communication system comprises communication devices that communicate with one another over network cables. The communication devices may comprise, for example, Ethernet transceivers, packet switches or any other suitable type of communication device. A network cable, in a disclosed embodiment, comprises one or more signal conductors for communicating signals between communication devices. The signal conductors are shielded by an inner shield layer and an outer shield layer that are electrically-insulated from one another by a suitable dielectric insulation layer.

At each of the communication devices connected to the network cable, the inner and outer shield layers are connected to different grounds and perform different functions, in an embodiment. The inner shield layer is connected to the circuit ground of the electronic circuitry of the communication device, and serves as a signal return path. The outer shield layer is connected to a different ground, e.g., to an enclosure of the communication device, and is used for reduction of EMI.

The disclosed grounding configuration of the shield layers provides a high degree of EMI suppression, both from the external environment to the signal conductions and vice versa. In addition, the disclosed configuration simplifies formation of a continuous 360-degree connection between the outer shield layer and the enclosure of the communication device at the connector. As a result, EMI suppression is further improved.

Various implementation examples are described herein. For example, in various embodiments the signal conductor (s) may comprise a differential twisted pair, a differential parallel pair or a single-ended coaxial center conductor. Each of the shield layers may comprise, for example, a metallic foil, a metallic braid or a combination of both.

In an alternative embodiment, instead of connecting the outer shield layer to the enclosure of the communication device, the outer shield layer is connected to an additional circuit ground of the electronic circuitry, different from the circuit ground that connects to the inner shield layer.

In some embodiments, the outer shield layer does not run along the entire length of the network cable, but instead only along a short section adjacent to the connector. Such a dual-shield section may be part of the network cable, or part of the connector of the communication device. Such embodiments reduce the cost of the network cable.

Example simulated performance of the disclosed shielding technique is given below.

FIG. 1 is a block diagram that schematically illustrates an automotive communication system 20 with high EMC performance cabling, in accordance with an embodiment that is described herein. System 20 is installed in a vehicle 24, and comprises multiple sensors 28, an Ethernet switch 48, multiple microcontrollers (μC) 32, a central controller (CC) 36, and multiple Ethernet physical layer (PHY) transceivers 40.

In various embodiments, sensors 28 may comprise any suitable types of sensors. Several non-limiting examples of sensors comprise video cameras, velocity sensors, accelerometers, audio sensors, infra-red sensors, radar sensors, lidar sensors, ultrasonic sensors, rangefinders or other proximity sensors, and the like.

In the present example, each sensor 28 is connected to a respective microcontroller (pC) 32, which in turn is connected to a respective PHY transceiver 40. The PHY transceiver 40 of each sensor 28 is connected by a network cable 44 to a port of switch 48. The switch-side end of cable 44 is typically connected to a peer PHY transceiver (not seen in the figure for clarity) within or coupled to switch 48, e.g., integrated as part of the switch port.

In the present context, PHY transceivers 40 and switch 48, which are connected by network cables 44, are referred to herein as communication devices. Additionally or alternatively, system 20 may comprise any other suitable types of communication devices. Network cables 44 are connected to the communication devices using connectors 52.

In various embodiments, the communication devices of system 20 may communicate over network cables 44 at any suitable bit rate. Example bit rates are 10 Mbps in accordance with IEEE 802.3cg (10Base-T1s), 100 Mbps in accordance with IEEE 802.3bw, 1 Gbps in accordance with IEEE 802.3 bp, or 10 Gbps in accordance with IEEE 802.3ch.

An inset at the bottom of FIG. 1 illustrates a pair of communication devices. In the present example the communication devices comprise switch 48 on the left-hand side (e.g., via an integrated PHY transceiver) and a PHY transceiver 40 on the right-hand side connected by a network cable 44. The communication devices each comprises a respective metallic enclosure 56, which encloses a Printed Circuit Board (PCB) 60 having electronic circuitry 64 disposed thereon. Electronic circuitry 64 may comprise, for example, a Media Dependent Interface (MDI) for coupling to cable 44, as well as any suitable transmission, reception and signal processing circuitry. Electronic circuitry 64 may vary from one PHY device to another, depending on the type of network or host system, for example.

Figure 2:
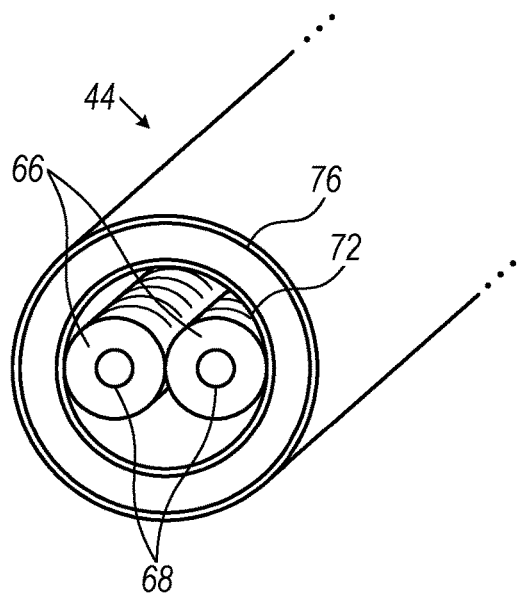
FIG. 2 is an isometric view of a network cable in the system of FIG. 1, in accordance with an embodiment that is described herein.

Network cable 44 comprises (i) one or more signal conductors 68, (ii) an inner shield layer 72 and (iii) an outer shield layer 76. Signal conductors 68 are configured to route communication signals between respective electronic circuitries 64 of the communication devices. Inner shield layer 72 surrounds conductors 68 (and is electrically insulated from conductors 68). Outer shield layer 76 surrounds inner shield layer 72 (and is electrically insulated from inner shield layer 72). A three-dimensional (3-D) view illustrating this structure is depicted in FIG. 2 and described further below. The insulation between conductors 68 and inner shield layer 72, and the insulation between inner shield layer 72 and outer shield layer 76, may comprise, for example, suitable dielectric insulation layers. Alternatively, each conductor 68 may be individually insulated by a respective insulating jacket, as seen for example in FIG. 2 below.

The inset of FIG. 1 also illustrates the grounding configuration of the two shield layers at connectors 52, in an embodiment. As seen, inner shield layer 72 is electrically-connected to the circuit ground of circuitry 64 (PCB ground on PCB 60 in the present example) by a connection 58. Outer shield layer 76 is electrically-connected to enclosure 56 (which is assumed to be metallic in the present example) by a connection 74. Connection 74, between outer shield layer 76 and enclosure 56, typically comprises a continuous 360-degree connection (e.g., a solder seam or a detachable connector) that encircles cable 44.

When using the dual grounding configuration comprising ground connections 58 and 74, each of the two separate shield layers performs a different role, and jointly achieve a high degree of EMI suppression. Inner shield layer 72, which is connected to the PCB ground of the communication device, serves as a signal return path. Outer shield layer 76, which is connected to enclosure 56 of the communication device, serves for diverting electrical noise currents induced by EMI.

In the present example cable 44 comprises two conductors 68 in a differential twisted-pair configuration. Alternatively, however, any other suitable number of conductors 68 can be used in any suitable configuration, e.g., a single-ended center conductor (e.g., coax), a twisted or parallel pair (e.g. STP or SPP), multiple twisted or parallel pairs, or a combination of single-ended and differential signal lines.

FIG. 2 is an isometric view of network cable 44, in accordance with an embodiment that is described herein. As seen, signal conductors 68 are shielded by inner shield layer 72 and by outer shield layer 76. In the present example, each of the two signal conductors 68 has its own insulating jacket 66, and these jackets also serve for insulating conductors 68 from inner shield layer 72. In alternative embodiments, cable 44 may comprise an additional insulation layer between conductors 68 and inner shield layer 72.

Further alternatively, cable 44 may have any other suitable configuration. Certain cable elements, such as an insulation layer between inner shield layer 72 and outer shield layer 76, and an outer jacket surrounding the entire cable 44, are not shown for the sake of clarity.

Figure 3:
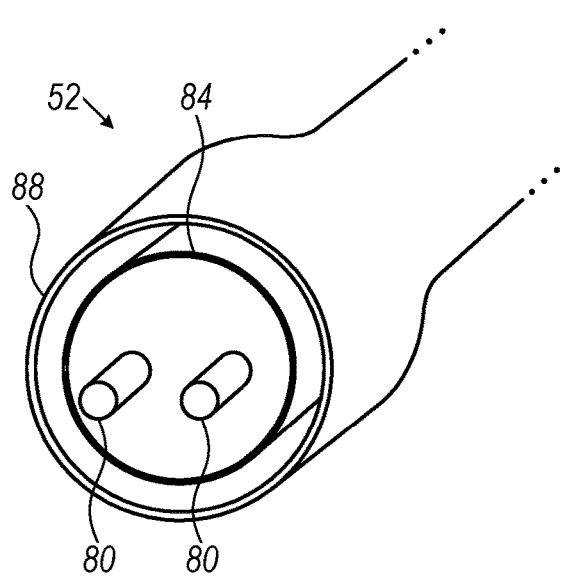
FIG. 3 is an isometric view of a connector in the system of FIG. 1, in accordance with an embodiment that is described herein.

FIG. 3 is an isometric view of connector 52, fitted at the end of network cable 44, in accordance with an embodiment that is described herein. In this embodiment connector 52 comprises (i) two signal terminals 80 that are connected to signal conductors 68, respectively, (ii) an inner shield connection 84 that is connected to inner shield layer 72, and (iii) an outer shield connection 88 that is connected to outer shield layer 76.

Typically, the communication device comprises a mating connector that is configured to mate with connector 52. The mating connector on the communication device typically has a similar structure, i.e., (i) signal terminals that are connected to circuitry 64, (ii) an inner shield connection that is connected to PCB ground on PCB 60, and (iii) an outer shield connection that is connected to enclosure 56.

Figure 4:
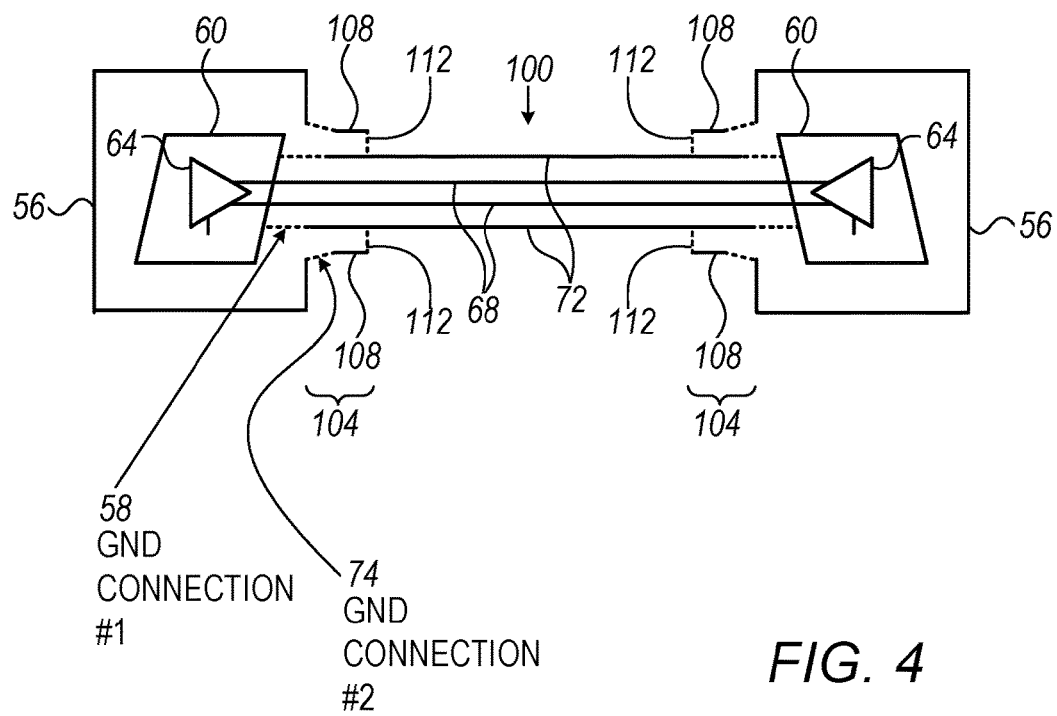
FIG. 4 is a block diagram that schematically illustrates high EMC performance cabling between communication devices, in accordance with an alternative embodiment that is described herein.

FIG. 4 is a block diagram that schematically illustrates high EMC performance cabling between communication devices, in accordance with an alternative embodiment that is described herein. In the present example, the communication devices are connected by a network cable 100 that comprises only a single shield layer (inner shield layer 72) for most of its length.

Only a short (or partial-length) section 104 (referred to herein as a dual-shield section) at each end of cable 100 comprises an outer shield layer 108 in addition to inner shield layer 72. The length of section 104 may be, for example, in the range of 1-20 cm, although any other suitable length can be used. At the communication-device end of section 104, the grounding configuration is similar to that of FIG. 1, i.e., inner shield layer 72 is connected to PCB ground by connection 58, and outer shield layer 108 is connected to the enclosure by connection 74.

In one embodiment, at the other end of section 104 (referred to in this context as the distal end of the dual-shield section), inner shield layer 72 and outer shield layer 108 are electrically-shorted to one another by a short 112. In other words, in the embodiment of FIG. 4, outer shield layer 108 runs from an end of network cable 100 up to a distal end of a partial section of the network cable.

In some embodiments, dual-shield section 104 is part of the connector of cable 100, and is thus detachable from the communication device. In other embodiments, dual-shield section 104 is part of the connector of the communication device, e.g., part of a panel connector fitted on enclosure 56. In the latter configuration, cable 100 may be a conventional, single-shield cable. In the former configuration, too, cable 100 has only a single shield layer along most of its length. The configuration of FIG. 4 thus enables using lower-cost, thinner cables. At the same time, the use of dual-shield sections 104 provides a high degree of EMI suppression at the connection points between the cable and the communication devices.

The configurations of network cables 44 and 100, and the communication devices they connect to, such as switch 48 and PHY device 40, are example configurations that are depicted solely by way of example. In alternative embodiments, any other suitable configurations can be used.

For example, in an alternative embodiment, instead of connecting outer shield layer (layer 76 of FIG. 1, or layer 108 of FIG. 4) to enclosure 56 of the communication device, the outer shield layer is connected to an additional cable or chassis ground on PCB 60. The additional cable ground is separate from the circuit ground of electronic circuitry 64. This additional ground connects to outer shield layer 76, and it is different and separate from the circuit ground (e.g., PCB ground) that connects to inner shield layer 72. The additional cable ground can be connected, for example, to the body of vehicle 24 or to earth ground through a low-impedance grounding connection path to divert the EMI noise currents from outer shield 76. Further alternatively, any other suitable ground, which is separate from the PCB ground, can be used. In applications other than automotive networks (e.g., in an industrial network), other suitable types of grounding may be used.

Figure 5:
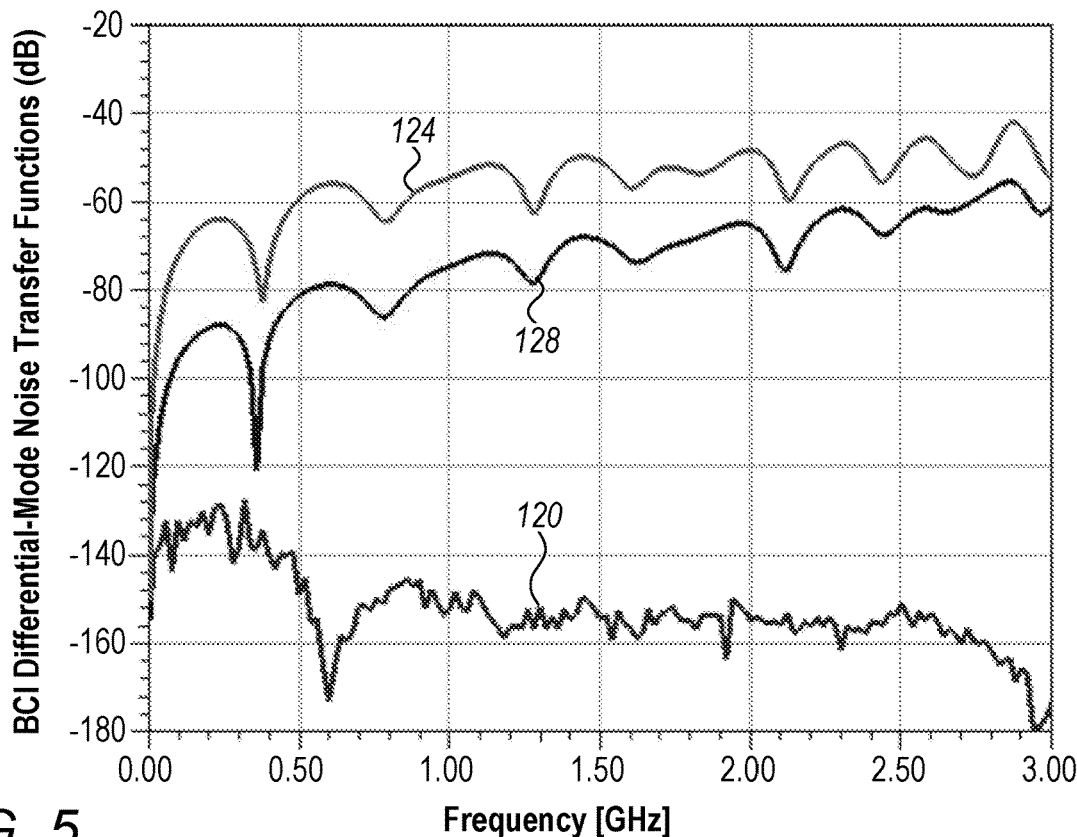
FIGS. 5 and 6 are graphs showing simulated performance of the disclosed high EMC performance cabling, in accordance with an embodiment that is described herein.
Figure 6:
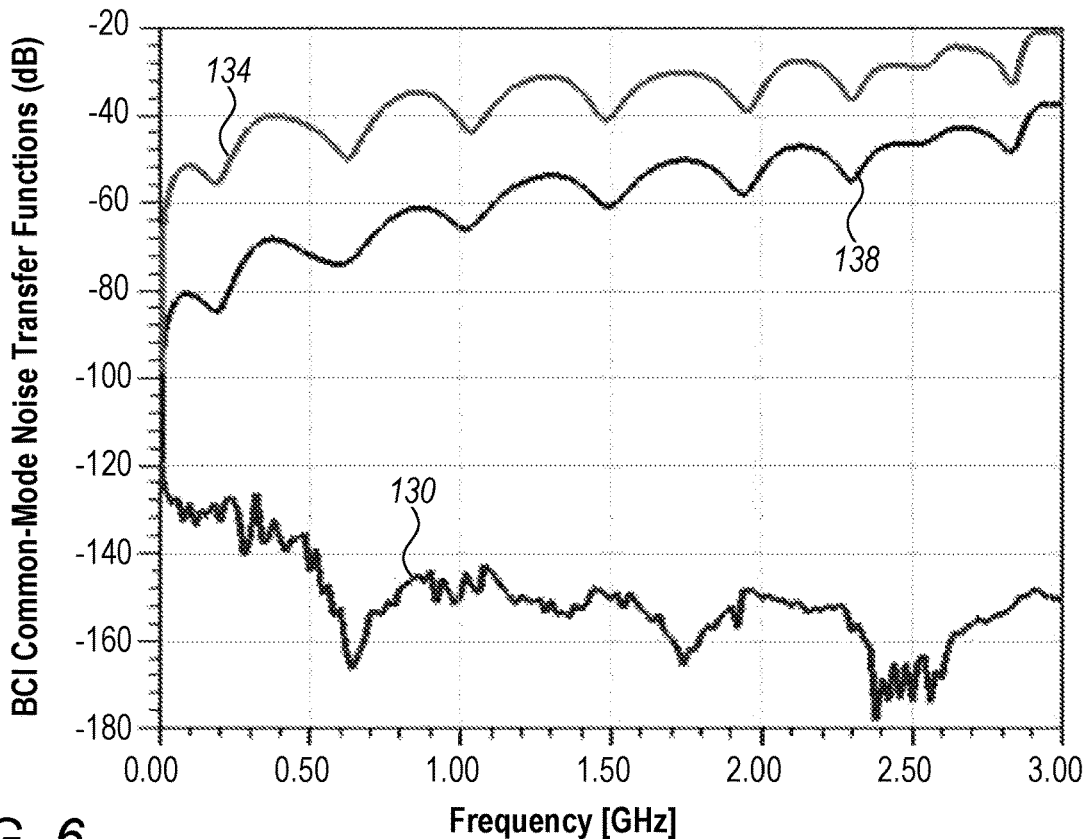

FIGS. 5 and 6 are graphs showing performance of the disclosed high EMC performance cabling, simulated using an electromagnetic simulation tool, in accordance with an embodiment that is described herein. The simulation tested the impact of EMI produced by a Bulk Current Injection (BCI) probe fitted around a network cable such as cable 44 (FIG. 1), as a function of frequency in the range 0-3 GHz.

FIG. 5 illustrates the differential-mode transfer function between the (simulated) BCI probe and signal conductors 68 in cable 44. A plot 120 illustrates the EMI suppression with the disclosed solution, i.e., with an internal shield layer connected to PCB ground and an external shield layer connected to the enclosure. A reference plot 124 shows the EMI suppression without an enclosure. A second reference plot 128 shows the EMI suppression with an enclosure, but without an electrical connection between the enclosure and the outer shield layer at the connector. As seen, without an electrical connection between the enclosure and the outer shield layer (plot 128) the achievable EMI suppression is on the order of 65-80 dB over the frequency range 1-2 GHz.

With the disclosed dual-grounding scheme (plot 120), the achievable EMI suppression over this frequency range is on the order of 150-160 dB.

FIG. 6 illustrates the common-mode transfer function between the simulated BCI probe and signal conductors 68 in cable 44. A plot 130 illustrates the EMI suppression with the disclosed solution. A reference plot 134 shows the EMI suppression without an enclosure. A second reference plot 138 shows the EMI suppression with an enclosure, but without an electrical connection between the enclosure and the outer shield layer at the connector. In this case, too, the disclosed technique provides an improvement of >70 dB over the majority of the frequency range.

Although the embodiments described herein mainly address automotive Ethernet networks, the methods and systems described herein can also be used in other applications, such as in industrial-site communication networks and home communication networks. The disclosed techniques can be used to address higher EMI protection needs with shielded cables for any application from consumer electronic products, residential electronics, commercial electronics to aerospace and defense industry applications, for example.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A network communication device, comprising:
communication circuitry configured to communicate signals over a network cable; and
a connector configured to connect to the network cable, the connector comprising:
one or more signal terminals configured to connect to one or more signal conductors of the network cable for communicating the signals,
an inner shield connection, wherein the inner shield connection surrounds the one or more signal terminals and is connected to a circuit ground of the communication circuitry, and
an outer shield connection, wherein the outer shield connection (i) surrounds the inner shield connection, (ii) is electrically-insulated from the inner shield connection, and (iii) is connected to an additional ground of the network communication device, the additional ground being different from the circuit ground.

2. The network communication device according to claim 1, wherein the inner shield connection is configured to provide a return path for the signals, and the outer shield connection is configured to reduce electromagnetic interference to and from the signals.

3. The network communication device according to claim 1, wherein the inner shield connection is configured to be connected to an inner shield layer of the network cable, wherein the outer shield connection is configured to be connected to an outer shield layer of the network cable, different from the inner shield layer.

4. The network communication device according to claim 1, wherein the connector comprises a dual-shield section that surrounds the one or more signal terminals and extends toward the network cable, wherein the inner and outer shield connections are electrically-insulated from one another along the dual-shield section and are electrically-shorted to one another at a distal end of the dual-shield section.

5. The network communication device according to claim 1, wherein the additional ground comprises an enclosure of the network communication device.

6. The network communication device according to claim 1, wherein the additional ground comprises an additional circuit ground of the communication circuitry.

7. A network cable, comprising:
one or more signal conductors that run along the network cable and are configured to communicate signals;
an inner shield layer that (i) runs along the network cable, (ii) surrounds the signal conductors and (iii) is electrically-insulated from the signal conductors;
an outer shield layer that (i) runs from an end of the network cable up to a distal end of a partial section of the network cable, (ii) surrounds the inner shield layer and (iii) is electrically-insulated from the inner shield layer along the partial section and electrically-shorted to the inner shield layer at the distal end of the partial section; and
a connector, wherein the connector is fitted at the end of the network cable and comprises (i) one or more signal terminals connected to the one or more signal conductors, (ii) an inner shield connection that surrounds the one or more signal terminals and is connected to the inner shield layer, and (iii) an outer shield connection that surrounds the inner shield connection and is connected to the outer shield layer.

8. The network cable according to claim 7, wherein the inner shield connection is configured to provide a return path for the signals, and the outer shield connection is configured to reduce electromagnetic interference to and from the signals.

9. A method for reducing electromagnetic interference in a network communication device, the method comprising:
connecting communication circuitry of the network communication device to one or more signal conductors of a network cable;
connecting a circuit ground of the communication circuitry to an inner shield layer of the network cable, wherein the inner shield layer surrounds the one or more signal conductors; and
connecting an additional ground of the network communication device, the additional ground being different from the circuit ground, to an outer shield layer of the network cable, wherein the outer shield connection (i) surrounds the inner shield connection and (ii) is electrically-insulated from the inner shield connection.

10. The method according to claim 9, wherein connecting the circuit ground to the inner shield layer comprises providing a return path for signals communicated via the one or more signal conductors, and wherein connecting the additional ground to the outer shield layer comprises reducing electromagnetic interference to and from the signals.

11. The method according to claim 9, wherein connecting the additional ground to the outer shield layer comprises connecting the additional ground to a dual-shield section that surrounds the one or more signal conductors, the inner and outer shield layers being electrically-insulated from one another along the dual-shield section and electrically-shorted to one another at a distal end of the dual-shield section.

12. The method according to claim 9, wherein connecting the additional ground to the outer shield layer comprises connecting the outer shield layer to an enclosure of the network communication device.

13. The method according to claim 9, wherein connecting the additional ground to the outer shield layer comprises connecting the outer shield layer to an additional circuit ground of the communication circuitry.

\* \* \* \* \*